United States Patent [19]
Takase et al.

[11] Patent Number: 6,037,599
[45] Date of Patent: Mar. 14, 2000

[54] ION IMPLANTATION APPARATUS AND FABRICATION METHOD FOR SEMICONDUCTOR DEVICE

[75] Inventors: Michihiko Takase, Urayasu; Bunji Mizuno, Ikoma, both of Japan

[73] Assignee: Matsushita Electric Industrial Co., Ltd., Osaka, Japan

[21] Appl. No.: 09/005,195

[22] Filed: Jan. 9, 1998

[30] Foreign Application Priority Data

Jan. 9, 1997 [JP] Japan ..................... 9-002065

[51] Int. Cl.[7] ........................................... H01J 37/00
[52] U.S. Cl. ............................ 250/492.21; 250/442.11; 250/251
[58] Field of Search ..................... 250/492.21, 442.11, 250/251

[56] References Cited

U.S. PATENT DOCUMENTS

| | | | |
|---|---|---|---|
| 5,378,899 | 1/1995 | Kimber | 250/492.21 |
| 5,525,807 | 6/1996 | Hirokawa et al. | 250/492.21 |
| 5,696,382 | 12/1997 | Kwon | 250/492.21 |
| 5,731,593 | 3/1998 | Kodama | 250/492.21 |

*Primary Examiner*—Kiet T. Nguyen
*Attorney, Agent, or Firm*—Pearne, Gordon, McCoy & Granger LLP

[57] ABSTRACT

An ion implantation apparatus has a wafer processing chamber which executes ion implantation on plural product wafers 2 while integrally revolving the product wafers 2 at a high speed in a locus passing through an irradiation range of ion beams 1. A wafer wheel 5 having plural wafer holders 4 which radially elongate from a rotating shaft 3 and which respectively hold the product wafers 2 is provided with an electrically conductive body 6 (7, 8) which is grounded and which passes through the irradiation range of the ion beams 1. Further, a method is provided in which ion implantation can be conduced without causing a charge-up, in a production step of a MOS semiconductor device of the extension structure. The source and drain regions of a MOS semiconductor of the extension structure are formed by using the ion implantation apparatus.

6 Claims, 5 Drawing Sheets

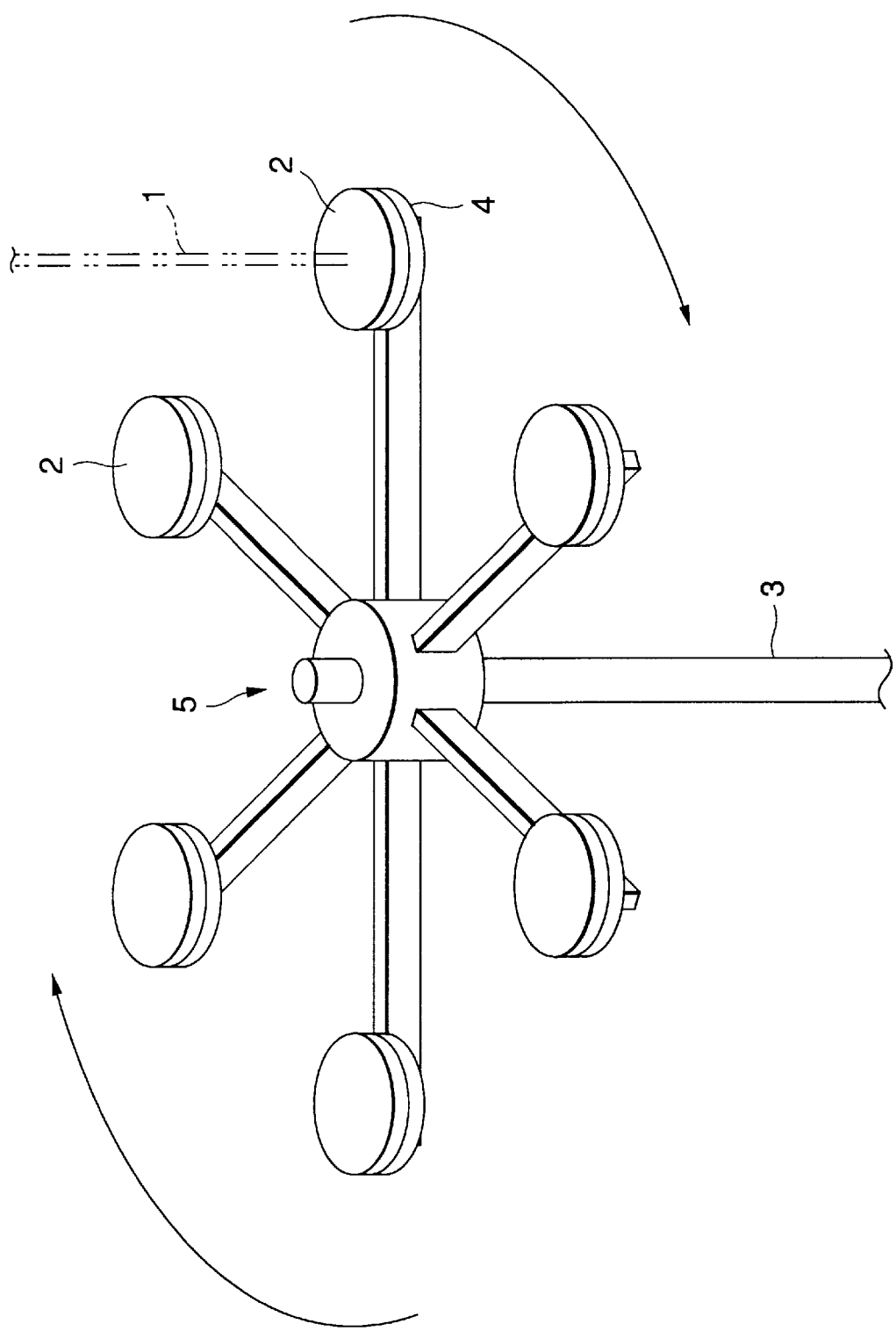

ION IMPLANTATION APPARATUS AND FABRICATION METHOD FOR SEMICONDUCTOR DEVICE

BACKGROUND OF THE INVENTION

The invention relates to an ion implantation apparatus, and particularly to a technique for suppressing a charge-up in a product wafer during an ion implantation, and also to a method of producing a semiconductor device by using the ion implantation apparatus.

Conventionally, some ion implantation apparatus have a wafer processing chamber (not shown). As shown in FIG. 5 in a simplified manner, such a wafer processing chamber executes ion implantation on plural product wafers 2 while integrally revolving the product wafers at a high speed of, for example, about 2,000 rpm in a locus passing through an irradiation range of ion beams 1. A wafer wheel 5 having plural wafer holders 4 is disposed in the wafer processing chamber. The wafer holders radially elongate from a rotating shaft 3 and respectively hold the product wafers 2. The rotating shaft 3 is grounded and subjected to a scanning operation while rotating the rotating shaft 3, whereby the whole faces of the product wafers 2 are irradiated with the ion beams 1.

Such an ion implantation apparatus of the prior art has the following disadvantage. Although illustration is omitted, when the surface of each of the product wafers 2 to be subjected to ion implantation is covered by an insulating film such as a silicon oxide film, a charge-up occurs during ion implantation. Specifically, positive charges are accumulated in the vicinity of the surface of the insulating film, and, when the accumulated amount of the positive charges exceeds the withstand voltage of the insulating film, a dielectric breakdown occurs. In the prior art, in order to avoid the disadvantage, a countermeasure (not shown) is taken as disclosed in Unexamined Japanese patent publication (Kokai) 63-207126. Namely, after a shield metal film made of aluminum or the like is formed on the surface of each of the product wafers 2, ion implantation is executed and the metal film is then thoroughly removed away.

When the prior art technique is employed, however, a shield metal film must be specially formed and then removed away. The steps for the formation and removal require extra labor and costs. Furthermore, the insulating film may be damaged in the step of removing the metal film, and there is a possibility that aluminum forming the metal film enters the product wafer 2 made of silicon or a junction portion. In such a case, an energy level due to metal contamination is formed, so that device properties are impaired.

After ion implantation, the product wafers 2 may be irradiated with an electromagnetic wave charged in a polarity which is opposite to that of charges accumulated in the surfaces of the product wafers 2. In the example described above, positive charges are accumulated in the surfaces of the product wafers 2. When the product wafers are irradiated with electrons of the opposite polarity so as to be electrically neutralized, a charge-up can be prevented from occurring.

In the charge neutralizing method, however, further production steps and apparatuses are required. Moreover, the irradiation amount of electrons must be set in accordance with the amount of charges accumulated in the surfaces of the product wafers 2. Therefore, it is difficult to optimize the method, and the neutralization cannot be always adequately conducted.

The above-mentioned charge accumulation in the surface of a wafer product is noticeable in a case where ions are implanted at a high concentration to a substrate, such as the formation of source and drain regions of a semiconductor device, particularly, a MOS semiconductor device of the extension structure. It has been requested to develop an effective countermeasure.

SUMMARY OF THE INVENTION

The invention has been conducted in view of these disadvantages. It is an object of the invention to provide an ion implantation apparatus in which a charge-up during ion implantation can be easily suppressed although it is not required to specially form a shield metal film on the surface of a product wafer and then remove the film and also to irradiate a product wafer with an electromagnetic wave to electrically neutralize the wafer. It is another object of the invention to provide a method in which ion implantation can be conducted without causing a charge-up, in a production step of a semiconductor device, particularly, a MOS semiconductor device of the extension structure.

The ion implantation apparatus of the invention has a wafer processing chamber which executes ion implantation on plural product wafers while integrally revolving the product wafers at a high speed in a locus passing through an irradiation range of ion beams, and is characterized in that a wafer wheel having plural wafer holders which radially elongate from a rotating shaft and which respectively hold the product wafers is provided with an electrically conductive body which is grounded and which passes through the irradiation range of the ion beams. When this configuration is employed, the electrically conductive body is revolved at a high speed in the same locus as that of the product wafers which are charged up during ion implantation, and passes through the irradiation range of the ion beams in the same manner as the product wafers. Therefore, charges of the space electromagnetic field which is produced by a charge-up of the product wafers are absorbed by the electrically conductive body. As a result, the charge-up of the product wafers during ion implantation is not raised to a level which is higher than the withstand voltage of an insulating film.

The method of producing a semiconductor device of the invention is characterized in that the method comprises a step of conducting ion implantation for forming source and drain regions of a semiconductor device, particularly, a MOS semiconductor device, by using the above-described ion implantation, and/or a step of conducting ion implantation to a gate electrode. According to the method, ion implantation can be conducted at a higher concentration without causing a charge-up, in a formation of source and drain regions of a MOS semiconductor device,-and a formation of a gate electrode.

The ion implantation apparatus according to the invention has a wafer processing chamber which executes ion implantation on plural product wafers while integrally revolving the product wafers at a high speed in a locus passing through an irradiation range of ion beams, and is characterized in that a wafer wheel having plural wafer holders which radially elongate from a rotating shaft and which respectively hold the product wafers is provided with an electrically conductive body which is grounded and which passes through the irradiation range of the ion beams. Further, in the ion implantation, the conductive body is configured by an electrically conductive plate-like member which is placed on one of the wafer holders and held by or integrated with the wafer holder.

The ion implantation apparatus according to the invention is characterized in that the conductive body of the ion implantation apparatus is configured by an electrically conductive rod-like or wire-like member which is disposed between adjacent ones of the wafer holders.

The method of fabricating a semiconductor device is characterized in that the method comprises a step of conducting ion implantation for forming source and drain regions of a MOS semiconductor device of an extension structure, by using an ion implantation apparatus as mentioned above.

BRIEF DESCRIPTION OF THE DRAWINGS

FIG. 5 is a view showing the internal structure of a wafer processing chamber disposed in an ion implantation apparatus of a prior art example, in a simplified manner.

DETAILED DESCRIPTION OF THE PREFERRED EMBODIMENTS

Hereinafter, embodiments of the invention will be described with reference to the accompanying drawings.
Embodiment 1

Figure 1:
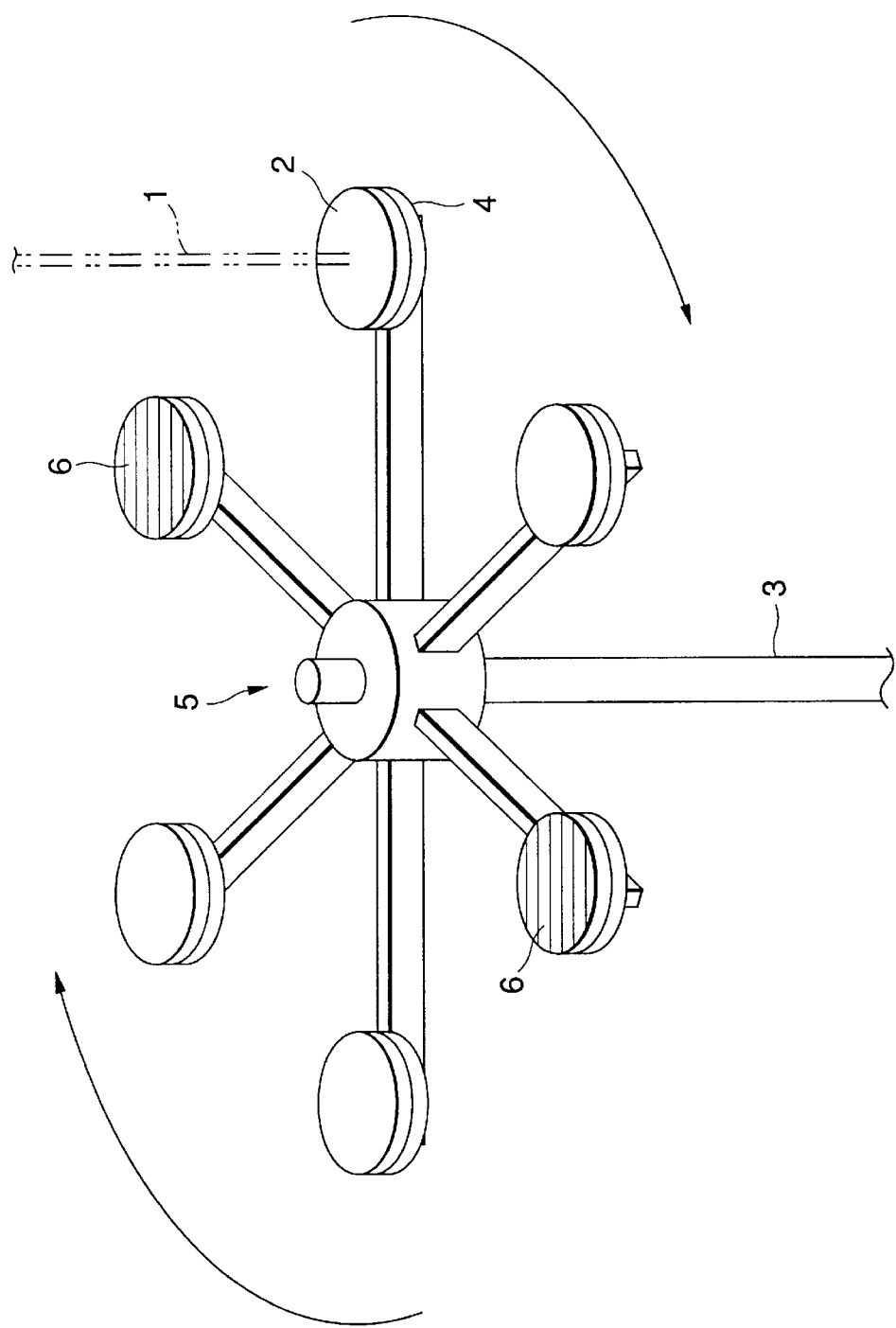
FIG. 1 is a view showing the internal structure of a wafer processing chamber disposed in an ion implantation apparatus of Embodiment 1, in a simplified manner.

FIG. 1 is a view showing the internal structure of a wafer processing chamber disposed in an ion implantation apparatus of Embodiment 1 of the invention, in a simplified manner. The internal structure of the wafer processing chamber of the Embodiment 1 is basically identical with that of the prior art example, and hence components and parts of FIG. 1 which are identical with those of FIG. 5 are designated by the same reference numerals.

In the same manner as the prior art example, the ion implantation apparatus of Embodiment 1 has a wafer processing chamber (not shown) which executes ion implantation on plural product wafers 2 while integrally revolving the product wafers at a high speed of, for example, about 2,000 rpm in a locus passing through an irradiation range of ion beams 1. A wafer wheel 5 having a rotating shaft 3 and plural wafer holders 4 is disposed in the wafer processing chamber. The rotating shaft is rotated so that the product wafers 2 are scanned along the irradiation range of the ion beams 1. The wafer holders radially elongate from the rotating shaft 3 and respectively hold the product wafers 2. The rotating shaft 3 constituting the wafer wheel 5 is grounded and also the wafer holders 4 are grounded through the rotating shaft 3.

The ion implantation apparatus of the embodiment is characterized in that an electrically conductive body which is grounded and which passes through the irradiation range of the ion beams 1 is disposed on the wafer wheel 5. Specifically, as an example of the electrically conductive body, a plate-like member 6 which is electrically conductive, for example, an N-type silicon substrate in which the silicon face is exposed is placed on one of the wafer holders 4. In other words, the ion implantation apparatus is different from the prior art example in that the conductive plate-like member 6 is held by each of several ones or at least one of the wafer holders 4 on which plural product wafers 2 are respectively placed to be held thereby. In this case, since the wafer holders 4 are grounded through the rotating shaft 3, also the plate-like members 6 held by the wafer holders 4 are grounded.

In the embodiment, the plate-like members 6 may be formed integrally with the respective wafer holders 4. Specifically, the plate-like members 6 may be previously integrated with several wafer holders 4 by bonding or the like, respectively.

N-type silicon substrates (hereinafter, referred to as sample substrates C) in which the silicon face remains to be exposed, and silicon substrates (hereinafter, referred to as sample substrates D) in which the whole face is covered by a polycrystalline silicon film of a thickness of 330 nm were prepared as dummy wafers corresponding to the electrically conductive plate-like members 6. For comparison, silicon substrates (hereinafter, referred to as sample substrates A) in which the whole face is covered by an insulative silicon oxide film of a thickness of 500 nm, and silicon substrates (hereinafter, referred to as sample substrates B) in which the whole face is covered by a photoresist film of a thickness of 1.5 μm were prepared as dummy wafers in which the surface is configured by an insulator. Thereafter, the dummy wafers were placed on the wafer holders 4 as shown in FIG. 1, and ion implantation experiments were then conducted. In FIG. 1, the total of the wafer folders 4 is six. In the experiments, twenty-four wafer folders 4 were used in total.

In the ion implantation experiments, ion implantation was executed while a silicon substrate for measuring the gate leak current (hereinafter, referred to as an evaluation substrate), i.e., an evaluation substrate in which a gate electrode (N-type polysilicon, thickness: 330 nm) is formed on a gate oxide film (thickness: 8 nm) was placed on one of the wafer holders 4, and substrates of one kind among the sample substrates A to D were held on the remaining wafer holders 4 (actually, 24 holders). Damages of the sample substrates A to D were evaluated in the following manner, on the basis of results of measurement of the gate leak current in the evaluation substrates which were processed simultaneously with the sample substrates A to D. Namely, the criterion was set so that, when the electric field of the gate oxide film is 10 MV/cm or higher in the case where the gate leak current density is 0.1 mA/cm$^2$, the product is judged to be good. The number of good products among 100 chips was defined as a yield to be used in the evaluation.

In the ion implantation experiments, PI-9500 produced by AMT corporation was used as an ion implantation apparatus, and $BF_2^+$ was implanted at an acceleration energy of 40 keV while rotating the wafer wheel 5 at a high speed of 1,250 rpm. The beam current was 10 mA.

In the ion implantation experiments, ion implantation was executed while a silicon substrate for measuring the gate leak current (hereinafter, referred to as an evaluation substrate), i.e., an evaluation substrate in which a gate electrode (N-type polysilicon, thickness: 330 nm) is formed on a gate oxide film (thickness: 8 nm) was placed on one of the wafer holders 4, and substrates of one kind among the sample substrates A to D were held on the remaining wafer holders 4 (actually, 24 holders). Damages of the sample substrates A to D were evaluated in the following manner, on the basis of results of measurement of the gate leak current in the evaluation substrates which were processed simultaneously with the sample substrates A to D. Namely, the criterion was set so that, when the electric field of the gate oxide film is 10 MV/cm or higher in the case where the gate leak current density is 0.1 mA/cm², the product is judged to be good. The number of good products among 100 chips was defined as a yield to be used in the evaluation.

The damage evaluation based on such ion implantation experiments revealed that, in the case where the antenna ratio of the gate electrode of each evaluation substrate was 1:2,000, the yields of the dummy wafers, namely, the sample substrates D, C, B, and A are gradually lowered in this sequence or 100%, 90%, 70%, and 20%. It was ascertained that, in the case where the sample substrates C or D which are electrically conductive were used as dummy buffers, a charge-up of each of the evaluation substrates is very low in level and the substrate is less damaged as compared with the case where the sample substrates A or B corresponding to the product wafers 2 were used as dummy wafers. It is considered that such experiment results were obtained because, as a dummy wafer has a higher electrical conductivity, a charge-up of the dummy wafer revolved at a high speed occurs more hardly.

Furthermore, the embodiment was compared with the charge neutralizing method. Experiments on ion implantation were conducted in the following manner. Silicon substrates (hereinafter, referred to as sample substrates E) in which the whole face is covered by an insulative silicon oxide film of a thickness of 660 nm, silicon substrates (hereinafter, referred to as sample substrates F) in which the whole face is covered by a photoresist film of a thickness of 1.5 μm, N-type silicon substrates (hereinafter, referred to as sample substrates G) in which the silicon face remains to be exposed, and silicon substrates (hereinafter, referred to as sample substrates H) in which the whole face is covered by a polycrystalline silicon film of a thickness of 330 nm and doped with N-type impurities were prepared as dummy wafers. Thereafter, the dummy wafers were placed on the wafer holders 4, and ion implantation experiments were then conducted. In the ion implantation experiments, PI-9500 produced by AMT Corporation was used as an ion implantation apparatus, and $BF_2^+$ was implanted at an acceleration energy of 40 keV while rotating the wafer wheel 5 at a high speed of about 2,000 rpm. The beam current was 10 mA.

In order to evaluate a damage due to a charge-up, comparisons were simultaneously conducted in the following manner. An evaluation substrate having the same structure as that described above was placed on one of the wafer holders 4, and substrates of one kind among the sample substrates E to H were held on the remaining wafer holders 4 (actually, 24 holders). At the same time, also comparisons between the case where the plasma flood system (PFS) is not used (OFF) and that where the system is used (ON) were conducted. Damages of the sample substrates E to H were evaluated in the following manner, on the basis of results of measurement of the gate leak current in the evaluation substrates which were processed simultaneously with the sample substrates E to H. Namely, the criterion was set so that, when the electric field of the gate oxide film is 10 MV/cm or higher in the case where the gate leak current density is 0.1 mA/cm², the product is judged to be good. The number of good products among 100 chips was defined as a yield to be used in the evaluation. The experiments were conducted by using evaluation substrates having different antenna ratios of the gate electrode and conductors, i.e., 1,000, 2,000, 3,000, 4,000, and 6,000. The results are shown in Table 1.

TABLE 1

| Antenna Ratio | PFS OFF | | | | PFS ON | | | |
|---|---|---|---|---|---|---|---|---|
| | Ex. E | Ex. F | Ex. G | Ex. H | Ex. E | Ex. F | Ex. G | Ex. H |
| 0 | 14 | 66 | 99 | 99 | 96 | 97 | 96 | 95 |
| 1000 | 16 | 64 | 97 | 99 | 82 | 90 | 83 | 89 |
| 2000 | 21 | 70 | 94 | 100 | 72 | 76 | 83 | 88 |
| 3000 | 21 | 65 | 97 | 100 | 91 | 86 | 85 | 88 |
| 4000 | 37 | 80 | 99 | 99 | 81 | 77 | 82 | 76 |
| 6000 | 33 | 71 | 100 | 100 | 63 | 63 | 59 | 72 |

From Table 1, the yields of the sample substrates G and H in the case of OFF are higher than those of the sample substrates E and F, and those of the sample substrates G and H in the case of ON. Therefore, it will be seen that the use of an electrically conductive dummy wafer can suppress the generation of a charge-up more effectively than the charge neutralizing method using the PFS.

In this way, ion implantation is executed while silicon substrates serving as the conductive plate-like members 6, such as silicon substrates in which the whole face is covered by a polycrystalline silicon film doped with impurities are placed on and held by one or more of the wafer holders 4 on which plural product wafers 2 are placed to be held thereby. As result, the conductive plate-like members 6 which are revolved at a high speed are moved in the same locus as that of the product wafers 2 which are charged up in the ion implantation, so as to pass through the irradiation range of the ion beams 1 in the same manner as the product wafers 2. In this case, charges in the space electromagnetic field which is induced by electrons generated by the charge-up of the product wafers 2 and also by the plate-like members 6 move among the product wafers 2 and the plate-like members 6, whereby a ring-shaped conduction state is produced in the vicinity of the locus. Therefore, such a conduction state is established and a charge-up in the product wafer 2 during the ion implantation is suppressed, with the result that the charge-up of the product wafers 2 is not raised to a level which is higher than the withstand voltage of the insulating film. The conductive plate-like members 6 are not restricted to silicon substrates. It is a matter of course that the conductive plate-like members may be configured by members of another kind, such as a metal plate coated by carbon or silicon carbide.

Embodiment 2

Figure 2:
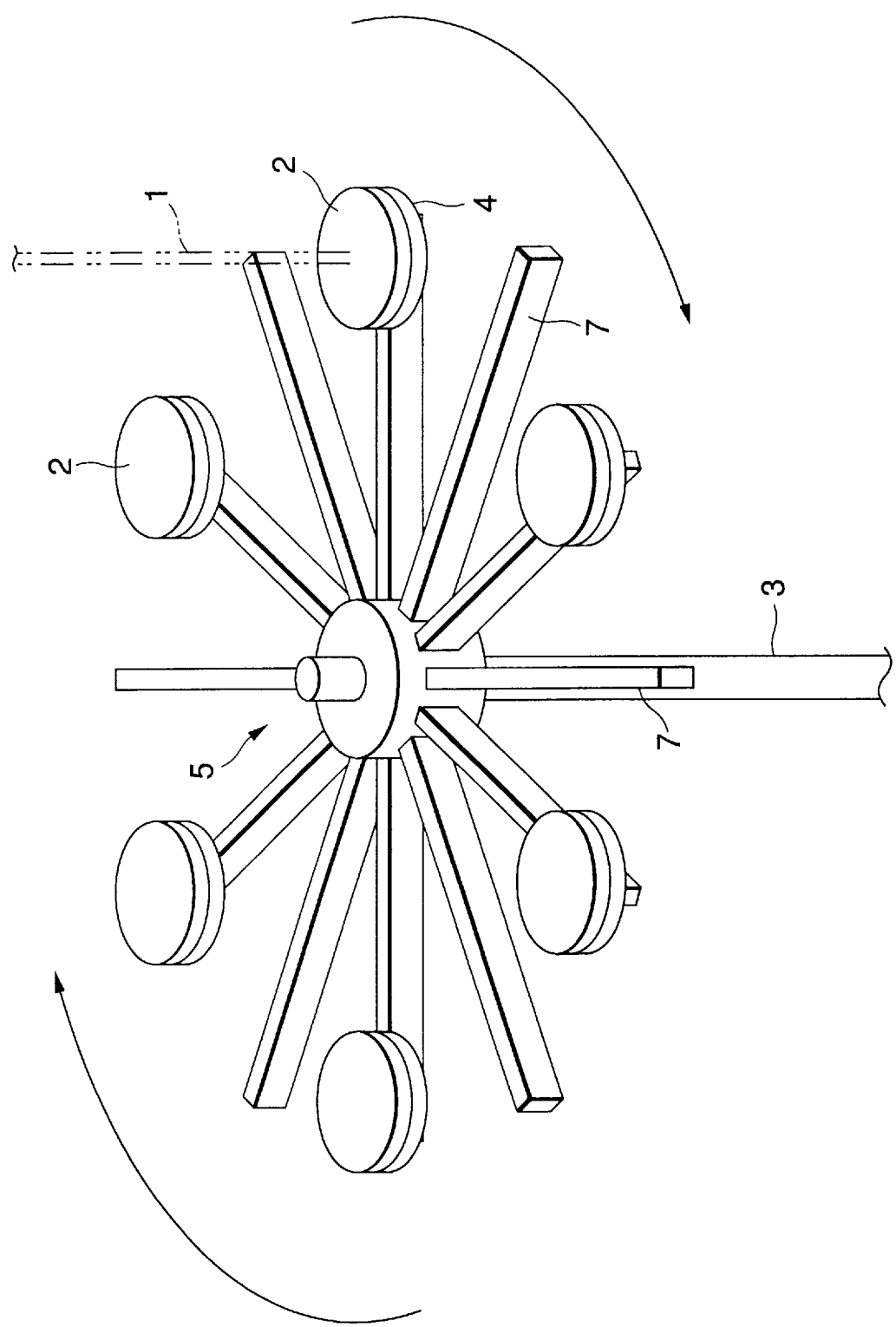
FIG. 2 is a view showing the internal structure of a wafer processing chamber disposed in an ion implantation apparatus of Embodiment 2, in a simplified manner.

In Embodiment 1, the conductive plate-like members 6 are placed on several ones of the wafer holders 4 and held thereby. The invention is not restricted to this configuration and may have another configuration such as shown in FIG. 2. FIG. 2 is a view showing the internal structure of a wafer processing chamber disposed in an ion implantation apparatus of Embodiment 2 of the invention, in a largely simplified manner. The internal structure of the wafer processing chamber of the Embodiment 2 is basically identical with that of Embodiment 1, and hence components and parts of FIG. 2 which are identical with those of FIG. 1 are designated by the same reference numerals.

The ion implantation apparatus of Embodiment 2 has a wafer processing chamber (not shown) which executes ion implantation on plural product wafers 2 while integrally revolving the product wafers at a high speed in a locus passing through an irradiation range of ion beams 1. A wafer wheel 5 having a rotating shaft 3 and plural wafer holders 4 is disposed in the wafer processing chamber. The rotating shaft is rotated so that the product wafers 2 are scanned along the irradiation range of the ion beams 1. The wafer holders radially elongate from the rotating shaft 3 and respectively hold the product wafers 2. In the ion implantation apparatus, an electrically conductive body which is grounded and which passes through the irradiation range of the ion beams 1 is disposed on the wafer wheel 5. In the embodiment, the electrically conductive body is configured by a rod-like member 7 which is made of a metal and coated with carbon. The rod-like member 7 is disposed between adjacent wafer holders 4, and fixed to the rotating shaft 3 so as to be grounded. At least one rod-like member 7 is attached to the rotating shaft 3.

Also in this configuration, in the same manner as Embodiment 1, ion implantation is executed while the conductive rod-like members 7 are revolved at a high speed in the same locus as that of the product wafers 2 which are charged up in the ion implantation, and pass through the irradiation range of the ion beams 1 in the same manner as the product. Consequently, charges of the space electromagnetic field which is produced by a charge-up of the product wafers 2 are absorbed by the rod-like members 7. Therefore, the charge-up of the product wafers 2 during ion implantation is suppressed by the absorption of charges by the rod-like members 7, with the result that the charge-up of the product wafers 2 is not raised to a level which is higher than the withstand voltage of the insulating film.

Embodiment 3

Figure 3:
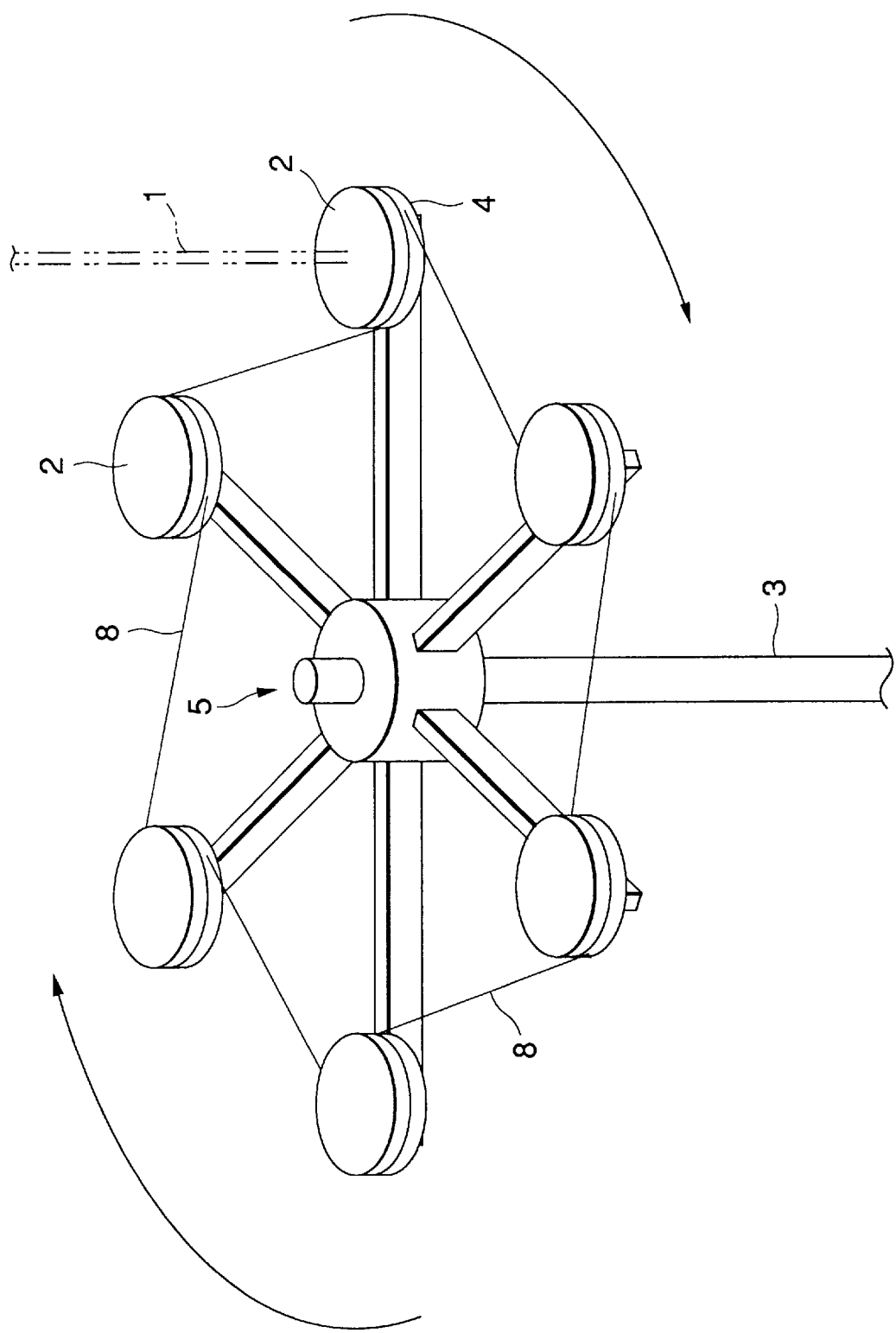
FIG. 3 is a view showing the internal structure of a wafer processing chamber disposed in an ion implantation apparatus of Embodiment 3, in a simplified manner.

The ion implantation apparatus may be configured in the following manner. As shown in FIG. 3, in place of the rod-like members 7, wire-like members 8 each configured by a metal wire which is coated by carbon may be disposed as the conductive body. The wire-like members 8 are bridged between outer and inner ends of respective adjacent ones of the wafer holders 4. In this case also, the electrically conductive wire-like members 8 pass through the irradiation range of the ion beams 1 while being revolved at a high speed in the same locus as that of the product wafers 2 which are charged up during ion implantation. Therefore, charges of the space electromagnetic field which is produced by a charge-up of the product wafers 2 are absorbed by the wire-like members 8, with the result that it is impossible that the charge-up of the product wafers 2 is raised to a level which is higher than the withstand voltage of the insulating film.

In Embodiments 2 and 3 described above, all the wafer holders 4 can hold the product wafers 2, respectively. Therefore, the embodiments are superior in production efficiency than Embodiment 1.

In each of the ion implantation apparatus described above, preferably, the electrically conductive body constituting the plate-like members 6 (Embodiment 1), the rod-like members 7 (Embodiment 2), or the wire-like members 8 (Embodiment 3) is made of a material having an electric conductivity which is as high as possible. Preferably, the electrically conductive body is made of a material which is higher in electric conductivity than at least aluminum of which the wafer holders 4 and the wafer wheel 5 are usually made. In view of contamination, it is preferable to use a material which does not volatilize at the temperature of the ion implantation. From this point of view, copper is preferable. More preferably, the surface of the body made of copper is coated by carbon or the like. It is considered that the space electromagnetic field is formed above the surfaces of the product wafers 2, i.e., on the side of the ion irradiation source. Therefore, it is more preferable to adjust the levels of the plate-like members 6, the rod-like members 7, and the wire-like members 8 so that their ion-irradiated surfaces are projected above or flush with the ion-irradiated surfaces of the product wafers 2.

Figure 4:
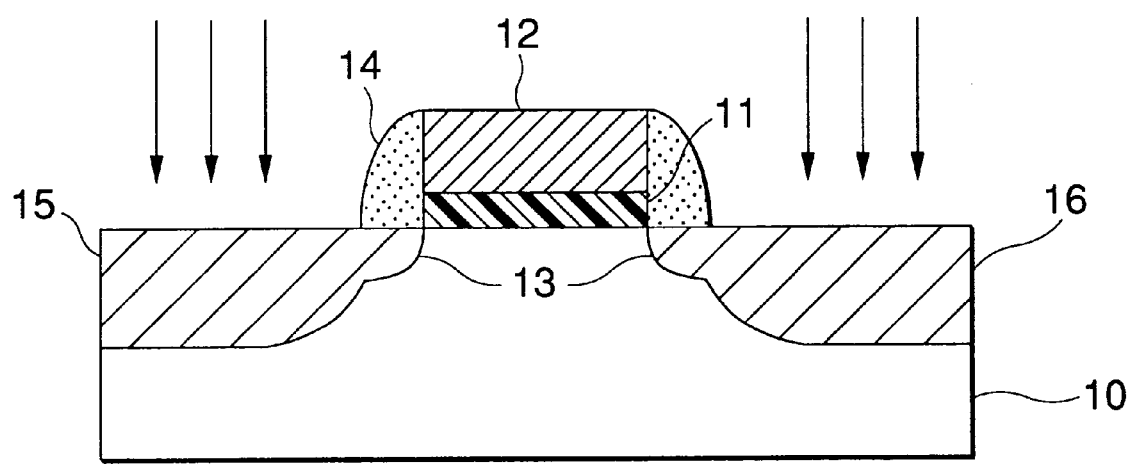
FIG. 4 is a diagram illustrating a method of producing a MOS semiconductor device of the extension structure.

The ion implantation apparatus of the invention described above is effective for a MOS semiconductor device, particularly, a MOS semiconductor device of the extension structure. A MOS semiconductor device of the extension structure is produced in the following manner. As shown in FIG. 4, first, a gate insulation film 11 and a gate electrode 12 are stacked on a substrate 10. Thereafter, a shallow ion implantation is conducted with using the gate electrode 12 as a mask, so as to form an extension region 13. A side wall 14 is formed on both the sides of the gate electrode 12. An ion implantation is then conducted with using the gate electrode 12 and the side wall 14 as a mask, so as to form a source region 15 and a drain region 16. In order to form the source region 15 and the drain region 16, ions must be deeply implanted into the substrate 10. In the prior art, a large amount of positive charges are accumulated in the gate electrode, and, in an extreme case, dielectric breakdown of the gate insulation film 11 occurs. When the ion implantation apparatus of the invention is used, however, the accumulated amount of positive charges is largely reduced, and the ion implantation can be conducted at a higher concentration without causing dielectric breakdown of the gate insulation film 11.

Similarly, also in the ion implantation for forming the gate electrode 12, the ion implantation can be conducted at a higher concentration without causing dielectric breakdown of the gate insulation film 11.

As described above, according to the ion implantation apparatus of the invention, the electrically conductive body is revolved at a high speed in the same locus as that of product wafers which are charged up during ion implantation, and passes through the irradiation range of ion beams in the same manner as the product wafers. Therefore, charges of the space electromagnetic field which is produced by a charge-up of the product wafers are absorbed by the electrically conductive body. As a result, the charge-up of the product wafers during ion implantation is not raised to a level which is higher than the withstand voltage of an insulating film. Consequently, the invention attains an effect that a charge-up during ion implantation can be easily suppressed. Furthermore, it is not required to specially form a shield metal film on the surface of the product wafer and then remove the film. Therefore, the invention attains further effects that the insulating film is not damaged by removal of such a metal film, and that metal contamination does not occur in the product wafers and the junctions.

According to the method of producing a semiconductor device of the invention, the use of the ion implantation apparatus allows ion implantation to be conducted at a higher concentration without causing a charge-up, particularly, in a formation of source and drain regions of a MOS semiconductor device of the extension structure, and ion implantation to a gate electrode.

What is claimed is:

1. An ion implantation apparatus having a wafer processing chamber that executes ion implantation on plural product wafers while integrally revolving the product wafers at a high speed in a locus passing through an irradiation range of ion beams, said ion implantation apparatus comprising:

a wafer wheel having plural wafer holders that radially elongate from a rotating shaft and which respectively hold the product wafers, said wafer wheel also including an electrically conductive body, said electrically conductive body being disposed between a pair of said plurality of wafer holders and associated product wafers, said electrically conductive body being grounded and passing through the irradiation range of the ion beams with said plural product wafers, said electrically conductive body being operable to reduce charge-up of said plural product wafers during ion implantation.

2. An ion implantation apparatus according to claim 1, wherein said electrically conductive body comprises an electrically conductive plate-like member which is placed on one of said plurality of wafer holders in place of one of said product wafers, said electrically conductive plate-like member being held by or integrated with said one wafer holder.

3. An ion implantation apparatus according to claim 1, wherein said electrically conductive body comprises an electrically conductive rod-like member.

4. An ion implantation apparatus according to any one of claims 1 to 3, wherein said conductive body is disposed coplanar to the product wafers in a rotating direction.

5. A method of producing a semiconductor device, comprising at least one of a step of conducting ion implantation for forming source and drain regions of a MOS semiconductor device, and a step of conducting ion implantation to a gate electrode, by using an ion implantation apparatus as claimed in claim 4.

6. A method of producing a semiconductor device, comprising at least one of a step of conducting ion implantation for forming source and drain regions of a MOS semiconductor device, and a step of conducting ion implantation to a gate electrode, by using an ion implantation apparatus as claimed in any one of claims 1 to 3.

* * * * *

UNITED STATES PATENT AND TRADEMARK OFFICE
CERTIFICATE OF CORRECTION

PATENT NO.   : 6,037,599
DATED        : March 14, 2000
INVENTOR(S)  : Takase et al.

It is certified that error appears in the above-indentified patent and that said Letters Patent is hereby corrected as shown below:

Column 2, line 50, delete "device,-and" and insert --device, and--.

Column 6, line 26, after "As" insert --a--.

Column 7, line 18, delete "Consequently ," and insert --Consequently,--.

Column 8, line 13, delete "conducting-with" and insert --conducting with".

Signed and Sealed this

Twentieth Day of March, 2001

Attest:

NICHOLAS P. GODICI

Attesting Officer        Acting Director of the United States Patent and Trademark Office